(12) United States Patent
Li et al.

(10) Patent No.: US 6,590,243 B2
(45) Date of Patent: Jul. 8, 2003

(54) FERROELASTIC LEAD GERMANATE THIN FILM AND DEPOSITION METHOD

(75) Inventors: Tingkai Li, Vancouver, WA (US); Fengyan Zhang, Vancouver, WA (US); Yoshi Ono, Camas, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/301,434

(22) Filed: Apr. 28, 1999

(65) Prior Publication Data

US 2002/0024072 A1 Feb. 28, 2002

(51) Int. Cl.$^7$ .......................... H01L 29/76; H01L 29/94; H01L 31/062; H01L 31/113; H01L 31/119
(52) U.S. Cl. ........................................ 257/295; 257/310
(58) Field of Search .................. 257/295, 310; 365/65, 117, 145; 377/101; 438/3, 240

(56) References Cited

U.S. PATENT DOCUMENTS

| | | | | |
|---|---|---|---|---|
| 3,717,562 A | * | 2/1973 | Schinke et al. | ......... 204/180 R |
| 5,111,186 A | * | 5/1992 | Narlow et al. | ........... 340/572.5 |
| 5,257,009 A | * | 10/1993 | Narlow | .................... 340/572.3 |
| 6,229,166 B1 | * | 5/2001 | Kim et al. | .................. 257/295 |

OTHER PUBLICATIONS

Zwicker et al., "Formation of secondary Phase during Crystal Growth of Pb5Ge3O11," J. of Electr. Mater., 6(2), p125, Feb. 1977.*
Haegawa et al., "Phase Relations and Crystallization of Glass in the System PbO–GeO2," J. of Mater. Science, 8 (12), pp. 1725–1730, Dec. 1973.*
Article entitled, "Processing of a Uniaxial Ferroelectric $Pb_5Ge_3O_{11}$ Thin Film at 450° C with C–Axis Orientation", by J.J. Lee and S.K. Dey, published in Appl. Phys. Lett. 60 (2), May 18, 1992, pp. 2487–2488.
Article entitled, "Ferroelectric and Optical Properties of $Pb_5Ge_3O_{11}$ and its Isomorphous Compound $Pb_5Ge_3SiO_{11}$", by H. Iwasaki, S. Miyazawa, H. Koizumi, K. Sugii & N. Niizeki, published in J. Appl. .Phys., vol. 43, No. 12, Dec. 1972, pp. 4907–4915.
Article entitled, Electro–optic Properties of Ferroelectric $5PbO—3GeO_2$ Single Crystal, by N. Uchida, T. Saku, H. Iwasaki & K. Onuki, published in J. Appl. Phys., vol. 43, No. 12, Dec. 1972, pp. 4933–4936.
Article entitled, "Oriented Lead Germanate Thin Films by Excimer Laser Ablation", by C.J. Peng, D. Roy and S.B. Krupanidhi, published in Appl. Phys. Lett. 60 (7), Feb. 17, 1992, pp. 827–829.
Article entitled, Evolution of Ferroelectricity in Ultrafine–grained $Pb_5Ge_3O_{11}$ Crystallized from the Glass, by A.M. Glass, K. Nassau & J.W. Shiever, published in J. Appl. Phys. 48(12) Dec. 1977, pp. 5213–5216.

(List continued on next page.)

*Primary Examiner*—Shouxiang Hu
(74) *Attorney, Agent, or Firm*—David C. Ripma; Matthew D. Rabdau; Scott C. Krieger

(57) ABSTRACT

A $Pb_3GeO_5$ phase PGO thin film is provided. This film has ferroelastic properties that make it ideal for many microelectromechanical applications or as decoupling capacitors in high speed multichip modules. This PGO film is uniquely formed in a MOCVD process that permits a thin film, less than 1 mm, of material to be deposited. The process mixes Pd and germanium in a solvent. The solution is heated to form a precursor vapor which is decomposed. The method provides deposition temperatures and pressures. The as-deposited film is also annealed to enhanced the film's ferroelastic characteristics. A ferroelastic capacitor made from the present invention PGO film is also provided.

9 Claims, 4 Drawing Sheets

OTHER PUBLICATIONS

Article entitled, 5PbO–3GeO$_2$ Crystal; A New Ferroelectric, by H. Iwasaki, K. Sugii, T. Yamada & N. Niizeki, published in Appl. Phys., vol. 18, No;. 10, May 15, 1971, pp. 444–445.

Article entitled, Elastic and Piezoelectric Properties of Ferroelectric 5PbO—3GeO$_2$ Crystals, by T. Yamada, H. Iwasaki & N. Niizeki, published in J. Appl. Phys. vol. 43, No. 3, Mar., 1972, pp. 771–775.

Article entitled, Electrical and Structural Properties of Flash–Evaporated Ferroelectric Lead Germanate Films on Silicon, by A Mansingh & S.B. Krupanidni, published in Thin Solid Films,80(1981) pp. 359–371.

Article entitled, Preparation and Properties of Thermally Evaporated Lead Germanate Films, by A. Mansingh & S.B. Krupanidhi, published in J. Appl. Phys. 51(10), Oct. 1980, pp. 5408–5412.

* cited by examiner

THE X-RAY PATTERN OF $Pb_3GeO_5$ FILMS DEPOSITED AT 550°C

THE MICROSTRUCTURE OF $Pb_3GeO_5$ FILMS DEPOSITED AT 550°C

FERROELASTIC LEAD GERMANATE THIN FILM AND DEPOSITION METHOD

BACKGROUND AND SUMMARY OF THE INVENTION

The present invention relates generally to the field of integrated circuit (IC) fabrication and, more particularly, to a ferroelastic lead germanate film and metal organic chemical vapor deposition (MOCVD) method for the above-mentioned thin film.

Ferroelastic films have attracted great interest in recent years because of their potential for use in applications such as high-energy storage capacitors and high-strain actuators/transducers. More recently, with the development of microelectronic devices, ferroelastic thin films have been explored for use in microactuators, microelectromechanical systems (MEMS), and as decoupling capacitors in high speed multichip modules (MCMs). It has been found that for charge storage applications, ferroelastics are superior to ferroelectrics because the stored charge can be completely released due to absence of remanent polarization. Ferroelastic films are superior to films with linear dielectrics because of their high dielectric constant and high charge storage density. However, it is difficult to obtain ferroelastic thin films with square hysteresis loops and zero remanent polarization.

The fabrication and characterization of ferroelastic lead germanium oxide thin films (PGO), especially $Pb_3GeO_5$ are of current interest. Lead germanate is a relative new materials. The $PbO$—$GeO2$ binary system has been studied by Speranskaya (1959). R. R. Neurgaonkar et al. grew single crystal of ferroelastic $Pb_3GeO_5$ by the Czochralski technique (1974). The ferroelastic properties in this material were first discovered by R. R. Neurgaonkar et al. The dielectric and electric-optics properties of single crystal and polycrystalline materials have been reported in the literature. The ferroelastic $Pb_3GeO_5$ belongs to the monoclinic space group P2 at room temperature. The crystals are ferroelastic, but show no phase transitions up to the melting point (738° C.). The interesting feature of this material is that $Pb_3GeO_5$ has ferroelastic properties, which are suitable for microelectromechanical system (MEMS) applications.

Ferroelectric lead germanate ($Pb_5Ge_3O_{11}$) thin films have been made by thermal evaporation and flash evaporation (A. Mansingh et al., 1980), dc reactive sputtering (H. Schmitt et al., 1984), laser ablation (S. B. Krupanidhi et al., 1991 and C. J. Peng et al., 1992), and sol-gel technique (J. J. Lee et al., 1992). However, ferroelastic $Pb_3GeO_5$ thin films made by MOCVD processes have not been reported.

The present invention PGO film has ferroelastic properties that are useful in microelectromechanical system (MEMS) and high speed multichip module (MCM) applications. In co-pending patent application Ser. No. 09/301,435, entitled "Multi-Phase Lead Germanate Film and Deposition Method", invented by Tingkai Li et al., filed on Apr. 28, 1999, attorney docket No. SLA400, a second phase of $Pb_3GeO_5$ is added to the $Pb_5Ge_3O_{11}$, increasing grain sizes without an increase in c-axis orientation. The resultant film has increased Pr values and dielectric constants, and decreased Ec values. Such a film is useful in MEM, MCM, DRAM, and FeRAM applications.

In co-pending patent application Ser. No. 09/301,420, entitled "C-Axis Oriented Lead Germanate Film and Deposition Method for Same", invented by Tingkai Li et al., filed on Apr. 28, 1999, attorney docket No. SLA401, the $Pb_5Ge_3O_{11}$ film is crystallographically oriented in the c-axis. This film has smaller Pr and dielectric constant values, and is useful in one transistor (1T) applications.

In co-pending patent application Ser. No. 09/302,272, entitled "Epitaxially Grown Lead Germanate Film and Deposition Method", invented by Tingkai Li et al., filed on Apr. 28, 1999, attorney docket No. SLA402, now U.S. Pat. No. 6,190,925, an epitaxial grown PGO film is disclosed with extremely high c-axis orientation. As a result, high Pr and Ec values, as well as lower dielectric constant, is obtained. Such a film is useful in 1T, and one transistor/one capacitor (1T/1C) FeRAM applications. The three above-mentioned co-pending patent applications are incorporated herein by reference.

It would be advantageous if a CVD process could be developed for the deposition of ferroelastic PGO thin films.

It would be advantageous if a CVD process, offering the advantages of excellent film uniformity, compositional control, high film densities, high deposition rates, excellent step coverage, and commercial amenability, could be developed for PGO processes.

Accordingly, a method for forming a ferroelastic lead germanium oxide (PGO) film on an integrated circuit (IC) IC wafer has been provided. Typically, the wafer is at least partially covered with a conductive electrode material of Ir or Pt. The method comprises the steps of:

a) mixing $[Pb(thd)_2]$ and $[Ge(ETO)_4]$ to form a PGO mixture having a molar ratio of about 3:1;

b) dissolving the mixture of Step a) with a solvent of tetrahydrofuran, isopropanol, and tetraglyme, having a molar ratio of about 8:2:1, respectively, to form a precursor solution having a concentration of approximately 0.1 to 0.5 moles of PGO mixture per liter of solvent;

c) introducing the precursor solution to a precursor vaporizer at a rate in the range of approximately 0.1 to 0.5 milliliters per minute (ml/mm), and heating the solution to create a precursor gas having a temperature in the range of approximately 180 to 250 degrees C and a precursor vapor pressure in the range of approximately 30 to 50 torr (T);

$c_1$) mixing the precursor gas in the chamber with an argon gas shroud flow in the range of approximately 4000 to 6000 square cubic centimeters per minute (sccm), preheated to a temperature in the range of approximately 170 to 250 degrees C;

$c_2$) introducing an oxygen flow to the reactor in the range of approximately 1000 to 3000 sccm, whereby a lead-germanium oxide with a c-axis orientation is promoted;

d) heating the wafer chuck to a temperature in the range of approximately 500 to 650 degrees C, establishing a reactor chamber pressure in the range of approximately 5 to 10 T, and decomposing the precursor gas on the IC wafer to form a PGO thin film with a thickness of less than 1 millimeter (mm), including a first phase of $Pb_3GeO_5$, whereby the PGO film having ferroelastic properties is formed;

e) cooling the PGO film to approximately room temperature in an oxygen atmosphere; and f) annealing the PGO film formed in Step d) in an atmosphere selected from the group of oxygen and oxygen with Pb atmospheres, with the oxygen being introduced at a partial pressure greater than approximately 20%, whereby the ferroelastic properties of the PGO film are improved.

In some aspects of the invention a ferroelectric device is formed with the PGO film, and further steps follow Step f) of:

g) forming a conductive electrode overlying the PGO film; and h) annealing the PGO film in an atmosphere selected from the group of oxygen and oxygen with Pb atmospheres, with the oxygen being introduced at a partial pressure greater than approximately 20%, whereby the interface between the PGO film and the electrode formed in Step g), is improved.

Typically, Steps f) and h) include using a rapid thermal annealing (RTA) process to anneal the PGO film, in which the temperatures are in the range of approximately 500 to 750 degrees C, for a duration in the range of approximately 10 to 30 minutes, and a thermal temperature ramp-up in the range of approximately 10 to 200 degrees C per second. Alternately, furnace annealing is performed at temperatures between 500 and 600 degrees for time durations of 30 minutes to 2 hours.

A lead germanium oxide (PGO) thin film having ferroelastic properties is also provided. The PGO film comprises a first phase of $Pb_3GeO_5$, with the thickness of the first phase of $Pb_3GeO_5$ being less than approximately 1 mm, whereby said $Pb_3GeO_5$ phase improves the ferroelastic properties of the PGO film. Typically, the first phase $Pb_3GeO_5$ has a grain size in the range of approximately 1 to 2 microns.

Also provided is a capacitor. The capacitor comprises a first conductive electrode, a PGO thin film including a first phase of $Pb_3GeO_5$ overlying the first electrode, and a second conductive electrode overlying the PGO film, whereby a PGO film capacitor is formed having ferroelastic properties. The capacitor has a dielectric constant in the range of approximately 50 to 100, and a leakage current of $4\times10^{-6}$ A/cm2 at 100 kV/cm. The minimum polarization voltage is approximately 1 volt, and the saturation voltage is less than approximately 5 volts.

DETAILED DESCRIPTION OF THE PREFERRED EMBODIMENT

The ferroelastic $Pb_3GeO_5$ thin films were prepared on Ir or Pt coated Si wafers by metalorganic vapor deposition (MOCVD) and RTP(Rapid Thermal Process) annealing techniques. The films were specular and crack free and showed completely crystallization between 500 and 650° C. Good ferroelastic properties were obtained for a 300 nm thick film with Ir or Pt electrodes. Polarization can be generated at an applied voltage as low as 1V, and almost complete saturation occurs at 5 V. Polarization disappears after removal of the applied voltage. The leakage currents increased with increasing applied voltage, and were found about $4\times10^{-6}$ A/cm² at 100 kV/cm. The dielectric constant showed the similar behavior to the most ferroelastic materials, which dielectric constant changing with respect to the applied voltage. The maximum dielectric constant was about 50–100. This high quality MOCVD $Pb_3GeO_5$ films can be used for applications of microelectromechanical system (MEMS) and decoupling capacitors in high speed multichip modules (MCMs).

The lead germanium oxide (PGO) thin film of the present invention has ferroelastic properties. These films comprise a first phase of $Pb_3GeO_5$. The thickness of said first phase of $Pb_3GeO_5$ is less than approximately 1 mm, whereby said $Pb_3GeO_5$ phase improves the ferroelastic properties of the PGO film. Typically, the first phase $Pb_3GeO_5$ has a grain size in the range of approximately 1 to 2 microns.

Figure 1:
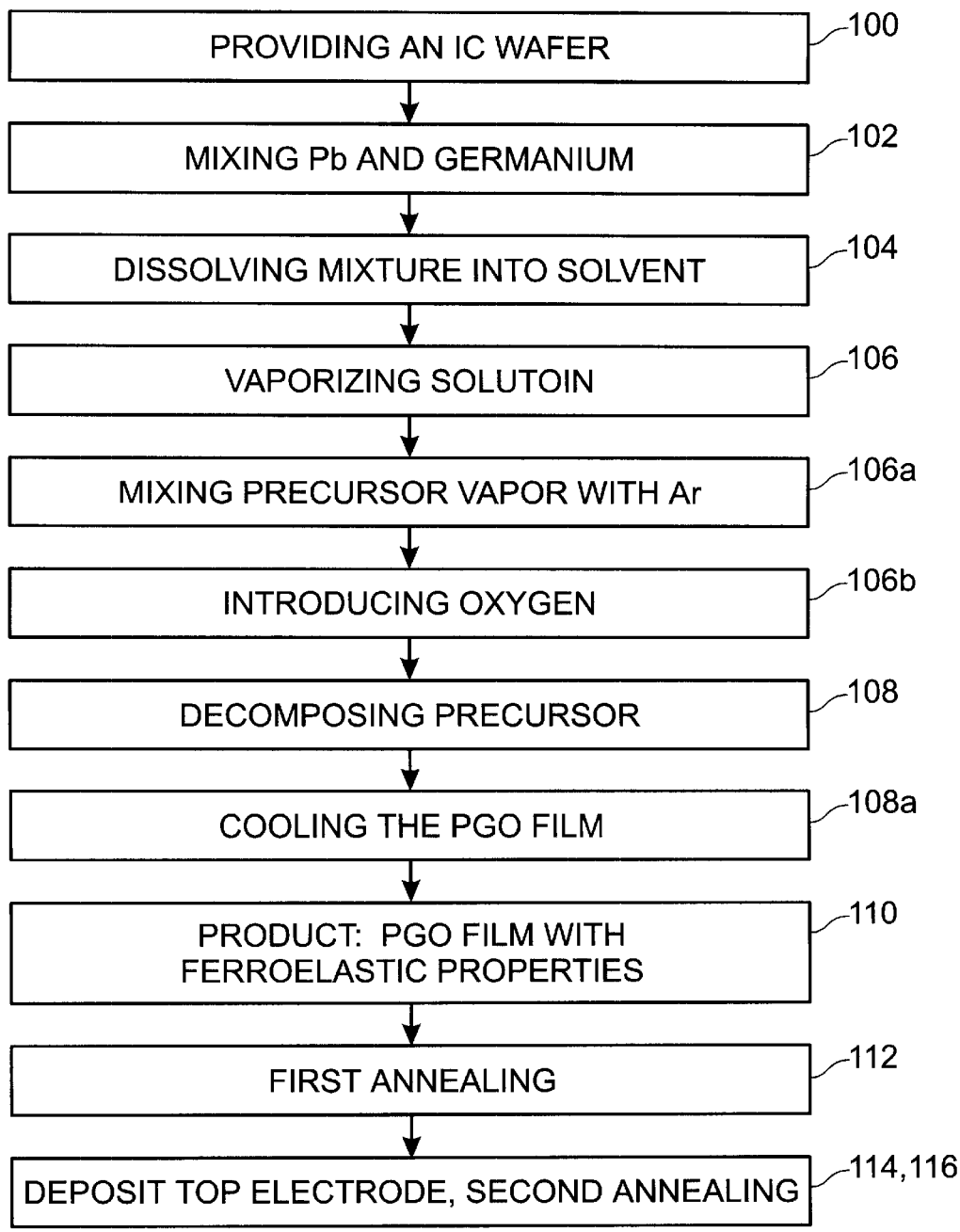
FIG. 1 illustrates steps in a method for forming a ferroelastic lead germanium oxide (PGO) film.

An EMCORE oxide, or other similar MOCVD reactor with liquid delivery system was used for the growth of $Pb_3GeO_5$ films. Such a system is shown in FIG. 1 of co-pending patent application Ser. No. 09/301,435, entitled "Multi-Phase Lead Germanate Film and Deposition Method", invented by Tingkai Li et al. The $Pb_3GeO_5$ films were deposited on 6" Pt or Ir covered Si wafers using MOCVD processes. The precursors for PGO thin films listed in Table 1.

TABLE 1

The properties of precursors for PGO thin films

| Precursors | Formula | Vapor Pressure (mm Hg) | Decomposition Temperature (° C.) |
|---|---|---|---|
| Pb(thd)$_2$ | Pb(C$_{11}$H$_{19}$O$_2$)$_2$ | 180° C./0.05 | 325° C. |
| Ge(ETO)$_4$ | Ge(C$_2$H$_5$O)$_4$ | b.p. 185.5° C. | |

[Pb(thd)$_2$] and [Ge(ETO)$_4$] in a molar ratio of 3:1 were dissolved in a mixed solvent of butyl ether (or tetrahydrofuran), isopropanol, and tetraglyme in the molar ratio of 8:2:1. The precursor solutions have a concentration of 0.1–0.5 M/L of $Pb_3GeO_5$. The solution was injected into a vaporizer (180–250° C.) by a pump at a rate of 0.1–0.5 ml/min to form precursor gases. The precursor gases were brought into the reactor using a preheated argon flow at 170–250° C. The deposition temperatures and pressure are 500–650° C. and 5–10 Torr, respectively. The shroud flow (Ar 4000–6000 sccm) with oxygen (1000–3000 sccm) was led into the reactor. After deposition, the $Pb_3GeO_5$ films were cooled down to room temperature in an oxygen atmosphere. The $Pb_3GeO_5$ films were post-annealed before, and after, deposition of the top electrodes using RTP method. The post-annealing step before deposition of top electrodes is defined herein as the first annealing, and the post-annealing after deposition of top electrodes is defined as the second annealing.

The basic composition, phase, and electrical properties of the some early experimental $Pb_3GeO_5$ films have been measured. The compositions of the $Pb_3GeO_5$ films were analyzed by using energy dispersion X-ray analysis (EDX). The phases of the films were identified using X-ray diffraction. The thickness and surface morphologies of the films on Ir/Ti/SiO$_2$/Si substrates were investigated by Scanning Electronic Microscope (SEM). The leakage currents and dielectric constants of the films were measured using HP4155-6 precision semiconductor parameter analyzer and Keithley 182 CV analyzer respectively. Other of the films were measured by a standardized RT66A tester.

The present invention PGO films were deposited at temperature about 500–650° C. The as-deposited films were specular, crack-free, and adhered well to the substrates. These films also showed very smooth surfaces as viewed by means of both optical microscopy and scanning electron microscopy. The film growth rates were typically in the range of 2–5 nm/min.

FIG. 1 illustrates steps in a method for forming a ferroelastic lead germanium oxide (PGO) film. Step 100 provides an integrated circuit (IC) wafer or film. Typically, a further step (not shown), precedes Step 102, of depositing a conductive electrode overlying the IC wafer. The conductive electrode material is selected from the group consisting of Ir and Pt. Step 102 mixes [Pb(thd)$_2$] and [Ge(ETO)$_4$] to form a PGO mixture having a molar ratio in the range of approximately 2:1 to 4:1. Typically, the molar ratio is approximately 3:1, but the ratio is altered in response to the temperature of the precursor vapor and the presence of a partial Pb atmosphere in the reactor chamber.

Step 104 dissolves the mixture of Step 102 with a solvent of tetrahydrofuran, isopropanol, and tetraglyme to form a precursor solution. In some aspects of the invention, Step 104 includes the solvents tetrahydrofuran, isopropanol, and tetraglyme being in a molar ratio of approximately 8:2:1, respectively. Typically, Steps 102 and 104 are performed simultaneously, and Step 104 includes forming a precursor solution having a concentration of approximately 0.1 to 0.5 moles of PGO mixture per liter of solvent. Tables 2 and 3 display precursor and solvents that are alternately used with the present invention process.

TABLE 2

The properties of precursors for PGO films

| Precursor | Formula | Appearance at room temperature | Moisture stability | Vapor Pressure (mm Hg) | Decomposition Temp. (° C.) |
|---|---|---|---|---|---|
| Ge(ETO)$_4$ | GeH$_4$ Ge$_2$H$_6$ Ge$_3$H$_8$ GE(OC$_2$H$_5$)$_4$ GeCl$_4$ (C$_2$H$_5$)$_2$-GeCl$_2$ | colorless liquid | sensitive | 185° C. | |
| Pb Tetraphenyl Pb(TMHD)$_2$ | Pb(C6-H5)4 Pb(C$_{11}$-H$_{19}$O$_2$)$_2$ Pb(C$_2$H$_5$)$_4$ | white powder white powder | | 230° C./ 0.05 180° C./ 0.05 | 325° C. 325° C. |

TABLE 3

The properties of solvents for PGO films

| Solvents | Formula | Boiling Temp. (° C.) |
|---|---|---|
| Tetrahydrofuran (THF) | C$_4$H$_8$O | 65–67° C. |
| Iso-propanol | C$_3$H$_7$OH | 97° C. |
| Tetraglyme | C$_{10}$H$_{22}$O$_5$ | 275° C. |
| Xylene | C$_6$H$_4$(CH$_3$)$_2$ | 137–144° C. |
| Toluene | C$_6$H$_5$CH$_3$ | 111° C. |
| Butyl ether | [CH$_3$(CH$_2$)$_3$]$_2$O | 142–143° C. |
| Butyl acetate | CH$_3$CO$_2$(CH$_2$)$_3$CH$_3$ | 124–126° C. |
| 2-Ethyl-1-hexanol | CH$_3$(CH$_2$)$_3$CH(C$_2$H$_6$)CH$_2$OH | 183–186° C. |

Step 106 heats the solution formed in Step 104 to create a precursor gas. Typically, Step 100 provides a precursor vaporizer auxiliary to the reactor, and Step 106 includes using the precursor vaporizer to heat the precursor solution to a temperature in the range of approximately 180 to 250 degrees C, whereby the precursor gas is formed. In some aspects of the invention, Step 100 provides a liquid pump. Then a further step is performed, following Step 104, and preceding Step 106. Step 104a (not shown) uses the liquid pump to introduce the precursor solution of Step 104 to the precursor vaporizer in Step 106 at a rate in the range of approximately 0.1 to 0.5 milliliters per minute (ml/min).

Step 108 decomposes the precursor gas formed in Step 106 on the IC wafer to form a PGO thin film, including a first phase of Pb$_3$GeO$_5$. Unlike a bulk material, Step 108 typically includes forming a PGO film having a film thickness of less than approximately 1 millimeter (mm). Step 110 is a product where the PGO film that is formed has ferroelastic properties.

In some aspects of the invention, Step 100 provides that the IC wafer is located in a reactor chamber or vacuum chamber. Alternately, the IC wafer is introduced in a step (not shown) before Step 108. Regardless, Step 106a mixes the precursor gas in the chamber with an argon gas shroud flow in the range of approximately 4000 to 6000 square cubic centimeters per minute (sccm), preheated to a temperature in the range of approximately 170 to 250 degrees C. Then, Step 106b introduces an oxygen flow to the reactor in the range of approximately 1000 to 3000 sccm.

Further, Step 100 provides that the IC wafer is located on a wafer chuck in the reactor with a chamber pressure established to promote the flow of precursor and gases. Step 106 includes establishing a precursor vapor pressure in the range of approximately 30 to 50 torr (T). Step 108 includes heating the wafer chuck to a temperature in the range of approximately 500 to 650 degrees C and establishing a reactor chamber pressure in the range of approximately 5 to 10 T. Alternately said, the oxygen partial pressure is greater than 10%, preferably in the range of approximately 20 to 50%.

Typically, a further step follows Step 108. Step 108a cools the PGO film to approximately room temperature in an oxygen atmosphere. Step 112 anneals the PGO film formed in Step 108 in an atmosphere selected from the group of oxygen and oxygen with Pb atmospheres, whereby the ferroelastic properties of the PGO film are improved. Typically the Pb atmosphere is in the range of approximately 0 to 30%.

In some aspects of the invention a ferroelastic device is formed with the PGO film of in Step 108. Then, further steps follow Step 112. Step 114 forms a conductive electrode overlying the PGO film. Step 116 anneals the PGO film in an atmosphere selected from the group of oxygen and oxygen with Pb atmosphere. The interface between the PGO film, formed in Step 108, and the electrode formed in Step 114, is improved. Typically, Steps 112 and 116 include the oxygen being introduced at a partial pressure greater than approximately 20%.

Steps 112 and 116 include using annealing methods selected from the group consisting of furnace annealing at a temperature in the range of approximately 500 to 600 degrees C for a duration of approximately 30 minutes to 2 hours, and rapid thermal annealing using temperatures in the range of approximately 500 to 750 degrees C. When RTA is used in Steps 112 and 116, the duration is in the range of approximately 10 to 1800 seconds, and the thermal temperature ramp-up in the range of approximately 10 to 200 degrees C per second. In some aspects of the invention, the first annealing step is a furnace anneal, and the second anneal is an RTA anneal. Steps 108, 112, and 118 include the $Pb_3GeO_5$ first phase having a grain size in the range of approximately 1 to 2 microns.

Figure 2:
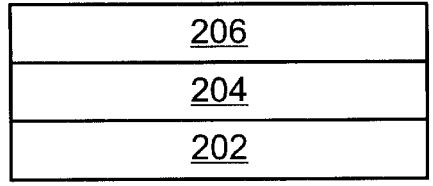
FIG. 2 illustrates a completed present invention capacitor.

FIG. 2 illustrates a completed present invention capacitor having ferroelastic properties. Capacitor 200 comprises a first conductive electrode 202, a PGO thin film 204 including a first phase of $Pb_3GeO_5$ overlying first electrode 202, and a second conductive electrode 206 overlying PGO film 204, whereby a PGO film capacitor is formed having ferroelastic properties.

Capacitor 200 has ferroelastic properties include a dielectric constant in the range of approximately 50 to 100, and a leakage current of $4\times10^{-6}$ A/cm2 at 100 kV/cm. The minimum polarization voltage is approximately 1 volt and the saturation voltage is approximately 5 volts.

Figure 3:
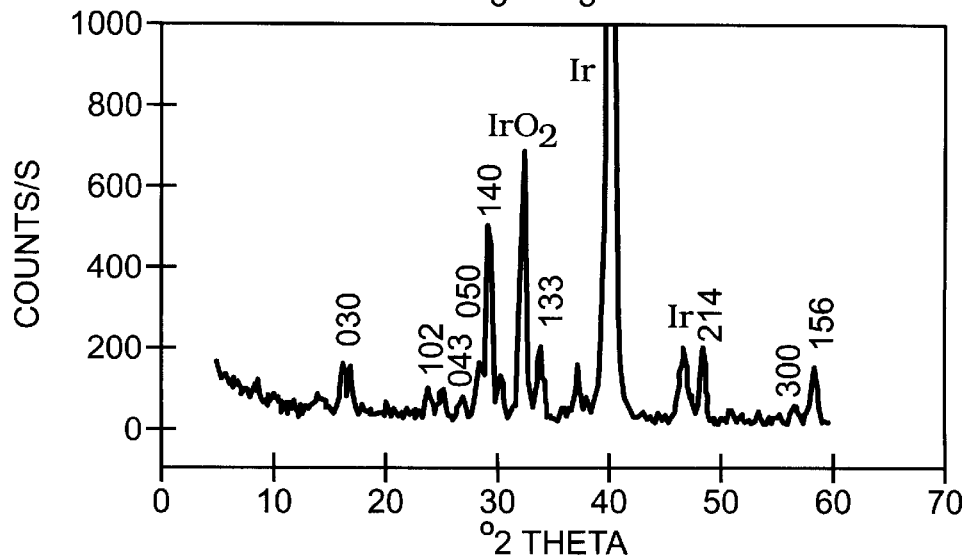
FIG. 3 is the X-ray pattern of $Pb_5Ge_3O_{11}$ films of the present invention deposited at 550° C.

FIG. 3 is the X-ray pattern of $Pb_3GeO_5$ films of the present invention deposited at 550° C. The composition and X-ray analysis confirm the formation of polycrystalline $Pb_3GeO_5$ films.

Figure 4:
FIG. 4 is a SEM micrograph of the present invention PGO film.

FIG. 4 is a SEM micrograph of the present invention PGO film. The average grain size of the films is about 1.5 $\mu$m. The thickness is measured about 300 nm. For the surface morphology, the film appears to have uniformly distributed fine grains, appears to be crack-free under SEM examinations.

Figure 5:
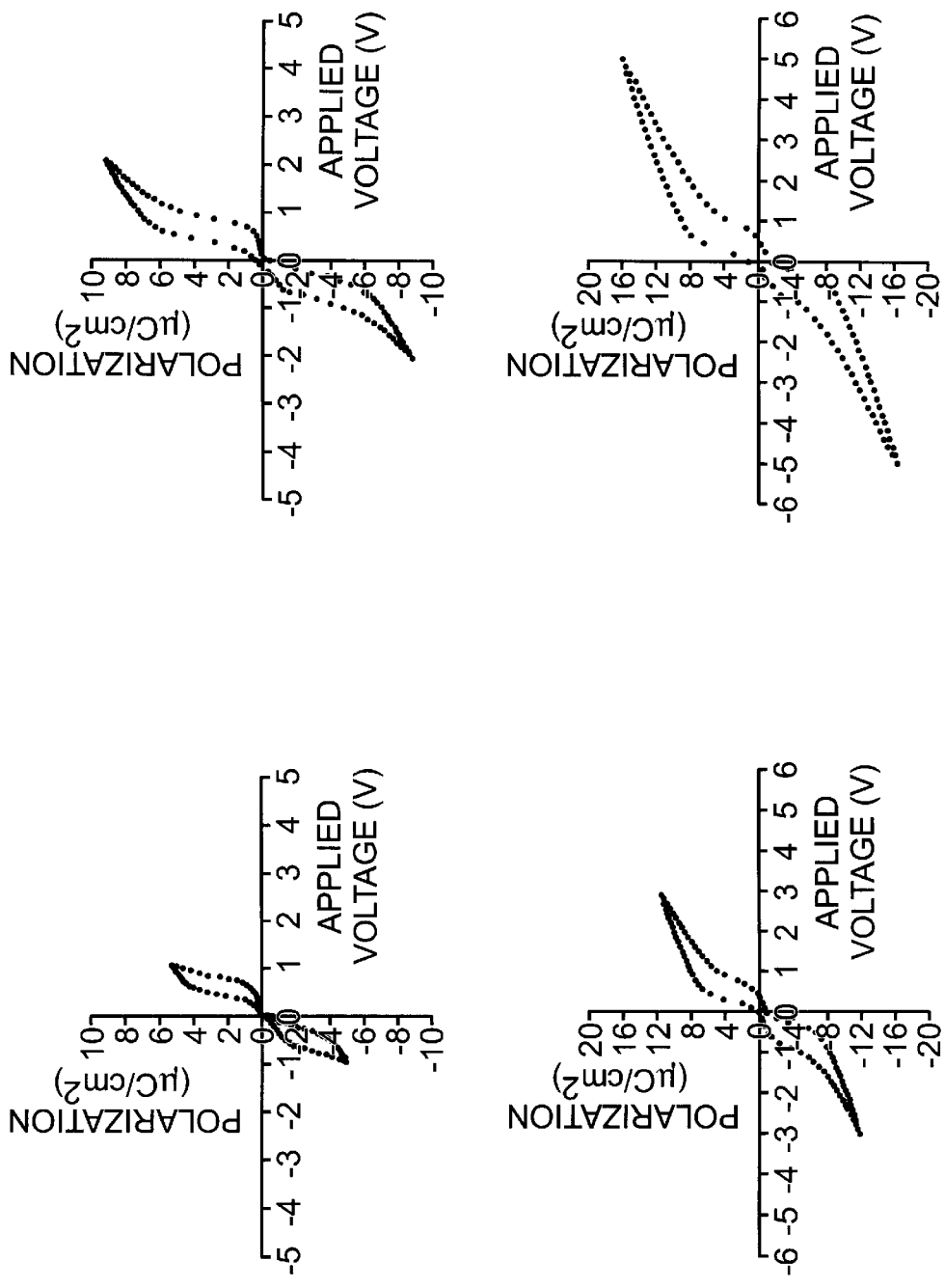
FIG. 5 illustrates maximum polarization (Pm) and switching fields (Es) of the present invention films.

FIG. 5 illustrates maximum polarization (Pm) and switching fields (Es) of the present invention films. The as-deposited $Pb_3GeO_5$ films show good ferroelastic properties. After the RTP annealing at 550–600° C. for 0.5 hour, the $Pb_3GeO_5$ films exhibited a symmetrical ferroelastic hysteresis loop with higher polarization (Pm) and lower switching field (Es). Polarization disappears after removal of the switching field, as shown in FIG. 5. Polarization appears even at very low switching voltage of 1V, and increases as the switching voltage increases.

Figure 6:
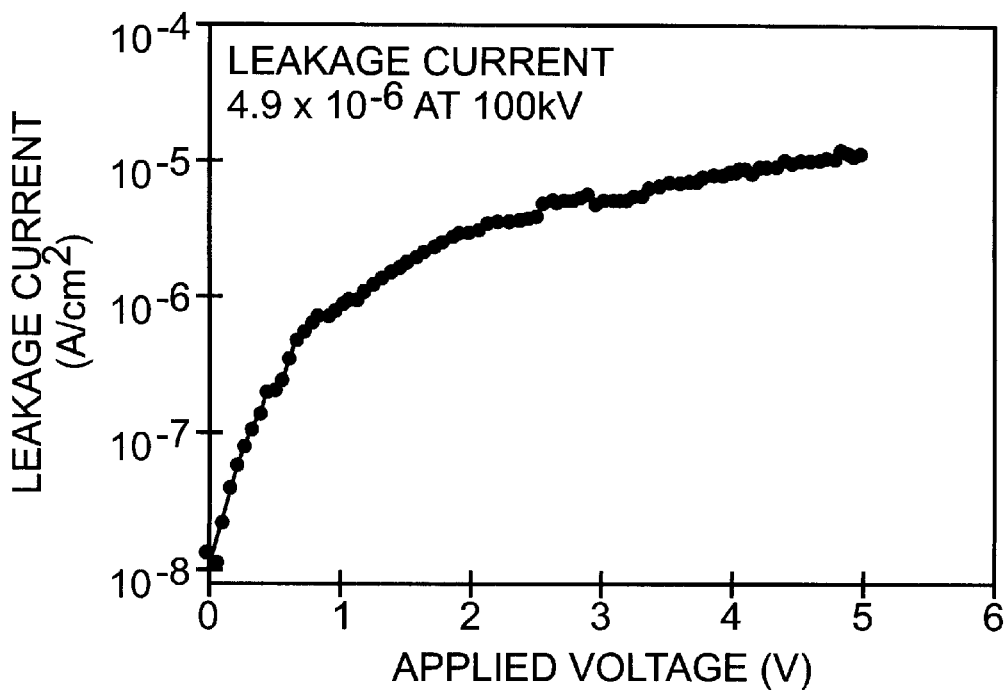
FIG. 6 illustrates an I-V curves of the present invention PGO film.

FIG. 6 illustrates an I-V curves of the present invention PGO film. Low leakage current density is an important consideration for microelectromechanical device applications. FIG. 6 shows the I-V curve of 300 nm thick MOCVD PGO films. Excellent I-V characteristics are observed. The leakage current density of the $Pb_3GeO_5$ thin films increases as the applied voltage is increased, and is about $4\times10^{-6}$ A/cm$^2$ at 100KV/cm.

Figure 7:
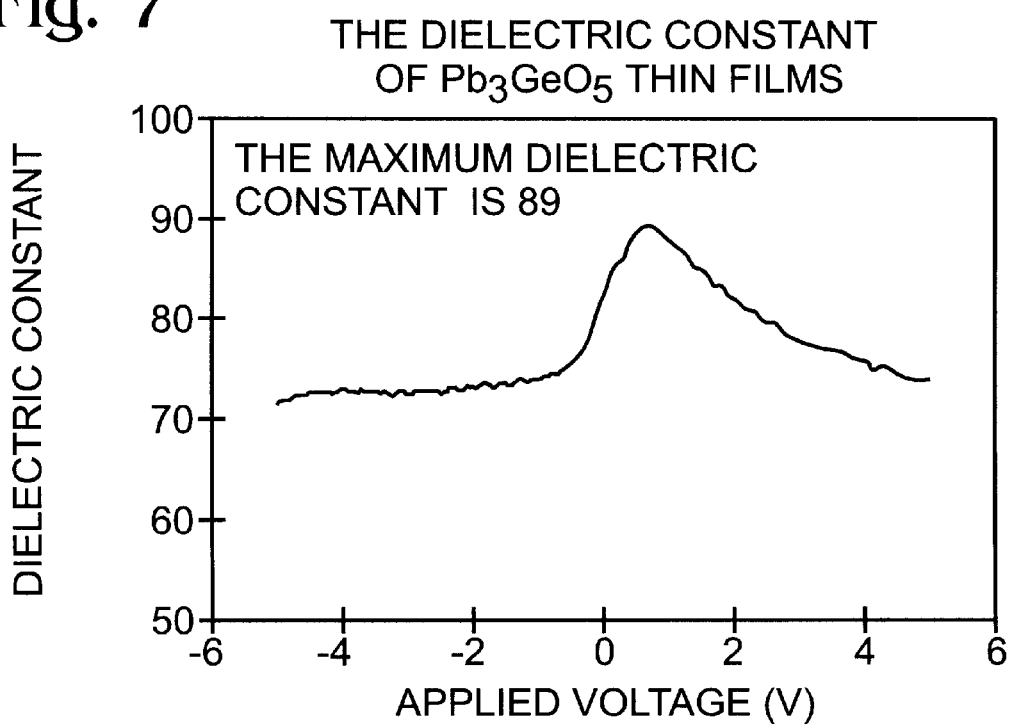
FIG. 7 illustrates the dielectric constant of the present invention PGO films.

FIG. 7 illustrates the dielectric constant of the present invention PGO films. The dielectric constant is also another important issue for microelectromechanical system (MEMS) and decoupling capacitors in high speed multichip modules (MCMs). The dielectric constant of the $Pb_3GeO_5$ thin films show behavior similar to the most ferroelastic materials, where the dielectric constant changes with applied voltage. The maximum dielectric constant of the $Pb_3GeO_5$ thin films is about 50–100. Note, FIGS. 3–7 illustrate the results of experimental films, and are not necessarily optimum values.

A $Pb_3GeO_5$ phase PGO thin film is provided. This film has ferroelastic properties that make it ideal for many microelectromechanical memory cell applications. This PGO film is uniquely formed in a MOCVD process that permits a thin film, less than 1 mm, of material to be deposited. A ferroelastic capacitor and MOCVD deposition method for this PGO film are also provided. Other embodiments and variations of the present invention will occur to those skilled in the art.

What is claimed is:

1. A capacitor comprising:

a first conductive electrode;

a lead germanium oxide (PGO) film overlying said first electrode, said PGO film consisting essentially of $Pb_3GeO_5$ having a grain size in the range of approximately 1 to 2 microns; and a second conductive electrode overlying said PGO film.

2. A capacitor as in claim 1 in which a dielectric constant of said PGO film is in the range of approximately 50 to 100.

3. A capacitor as in claim 1 in which a leakage current density of the capacitor is $4\times10^{-6}$ A/cm2 at 100 kV/cm.

4. A capacitor as in claim 1 in which a minimum polarization voltage of the capacitor is approximately 1 volt and a saturation voltage of the capacitor is approximately 5 volts.

5. A ferroelastic capacitor in an integrated circuit device comprising:

a substrate;

a PGO film on said substrate and consisting essentially of $Pb_3GeO_5$ having a rain size in the range of approximately 1 to 2 microns; and a conductive electrode overlying said PGO film.

6. A ferroelastic capacitor in an integrated circuit device as in claim 5 in which said PGO film has a thickness of less than approximately 1 mm.

7. A PGO film capacitor for use in integrated circuit devices consisting essentialiy of:

$Pb_3GeO_5$, wherein said PGO film has a thickness of less than approximately 1 mm and a rain size in the range of approximately 1 to 2 microns.

8. In an integrated circuit, a ferroelastic capacitor comprising:

a first conductive electrode selected from the group consisting of Ir and Pt;

a lead germanium oxide (PGO) film overlying said first conductive electrode, said PGO film consisting essentially of $Pb_3GeO_5$ having a grain size in the range of approximately 1 to 2 microns; and a second conductive electrode overlying said PGO film.

9. A ferroelastic capacitor as in claim 8 in which said PGO film has a thickness of less than approximately 1 mm.

* * * * *